United States Patent
Hodel et al.

(10) Patent No.: US 8,133,765 B2
(45) Date of Patent: Mar. 13, 2012

(54) INTEGRATED RF ESD PROTECTION FOR HIGH FREQUENCY CIRCUITS

(75) Inventors: Uwe Hodel, Munich (DE); Wolfgang Soldner, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/946,998

(22) Filed: Nov. 16, 2010

(65) Prior Publication Data

US 2011/0058292 A1 Mar. 10, 2011

Related U.S. Application Data

(62) Division of application No. 12/020,386, filed on Jan. 25, 2008, now Pat. No. 7,973,365.

(51) Int. Cl.
| | |
|---|---|
| *H01L 21/00* | (2006.01) |
| *H02H 9/00* | (2006.01) |
| *H02H 9/04* | (2006.01) |
| *H02H 3/32* | (2006.01) |

(52) U.S. Cl. ......... 438/129; 438/237; 438/309; 361/56; 361/58; 361/91.1; 361/211; 361/212

(58) Field of Classification Search .................. 438/129, 438/237, 309; 361/56, 58, 91.1, 211, 212
See application file for complete search history.

(56) References Cited

U.S. PATENT DOCUMENTS

| | | | |
|---|---|---|---|
| 5,416,660 A | 5/1995 | Shiga | |
| 6,628,498 B2 | 9/2003 | Whitney et al. | |
| 6,847,511 B2 | 1/2005 | Ohnakado et al. | |
| 7,402,846 B2 | 7/2008 | Schwantes et al. | |
| 2001/0040490 A1 | 11/2001 | Tanaka | |
| 2006/0256489 A1 | 11/2006 | Ker et al. | |
| 2007/0120190 A1 | 5/2007 | Schwantes et al. | |
| 2007/0263330 A1* | 11/2007 | Knapp et al. | 361/56 |
| 2007/0285860 A1 | 12/2007 | Shintani et al. | |
| 2009/0050970 A1 | 2/2009 | Schneider et al. | |

FOREIGN PATENT DOCUMENTS

| | | |
|---|---|---|
| DE | 10 2006 022066 A1 | 11/2007 |
| JP | 2002-091338 | 3/2002 |

OTHER PUBLICATIONS

Ito, C., et al., "Analysis and Design of Distributed ESD Protection Circuits for High-Speed Mixed-Signal and RF ICs," IEEE Transactions on Electron Devices, Aug. 2002, pp. 1444-1454, vol. 49, No. 8, IEEE.

(Continued)

*Primary Examiner* — Long Tran
(74) *Attorney, Agent, or Firm* — Slater & Matsil, L.L.P.

(57) ABSTRACT

The invention relates to a high-frequency integrated circuit requiring ESD protection for a circuit node. One or more metallic layer is deposited within the integrated circuit and patterned to form a transmission line. The metallic layers are generally already present in the integrated circuit for signal routing. The transmission line is coupled between the circuit node and a terminal of an ESD protection device, with a transmission line return conductor coupled to a high-frequency ground. The transmission line is formed with an electrical length that transforms the impedance of the ESD protection device substantially into an open circuit at the circuit node at an operational frequency of the integrated circuit. The other terminal of the ESD protection device is coupled to the high-frequency ground.

17 Claims, 7 Drawing Sheets

OTHER PUBLICATIONS

Kleveland, B., et al., "Distributed ESD Protection for High-Speed Integrated Circuits," IEEE Electron Device Letters, Aug. 2000, pp. 390-392, vol. 21, No. 8, IEEE.

Soldner, W., et al., "RF ESD Protection Strategies: Codesign vs. Low-C Protection," 2005 EOS/ESD Symposium, 10 pp., ESD Association.

Kayali, S. et al., GaAs MMIC Reliability Assurance Guideline forSpace Applications, JPL Publication 96-25, Dec. 15, 1996, 221 pages, see, in particular pp. 60 and 61, National Aeronauics and Space Administration, Jet Propulsion Laboratory, California Institute of Technology, Pasadena, Ca.

* cited by examiner

INTEGRATED RF ESD PROTECTION FOR HIGH FREQUENCY CIRCUITS

This is a divisional application of U.S. application Ser. No. 12/020,386, entitled "Integrated RF ESD Protection for High Frequency Circuits," which was filed on Jan. 25, 2008, now U.S. Pat. No. 7,973,365 and is incorporated herein by reference in its entirety.

TECHNICAL FIELD

An embodiment of the invention relates generally to integrated circuits, semiconductor devices, and methods, and more particularly to ESD (electrostatic discharge) protection for high-frequency circuits and method of protecting a high-frequency integrated circuit against electrostatic discharge.

BACKGROUND

As electronic circuits continue to become smaller, operate at higher frequencies, and are widely applied in unprotected environments, it has become easier to either completely destroy or otherwise impair electronic components therein by application of voltages beyond component ratings. In particular, many integrated circuits and semiconductor devices are highly susceptible to damage from the unintended discharge of static electricity, generally as a result of handling or from physical contact with another charged body, or from electrical overstress. Electrostatic discharge is the transfer of an electric charge between bodies at different electrostatic potentials (voltages), caused by direct contact, or induced by an electrostatic field. Electrical overstress generally refers to the occurrence of a transient voltage, and even a steady voltage such as due to a component failure, in a circuit above its rated operating voltage. These events have become a critical problem for the electronics industry.

Device failures that result from ESD events are not always immediately catastrophic or apparent. Often, the device is only slightly weakened but is less able to withstand normal operating stresses and, hence, may result in a reliability problem or a reduced lifetime. Therefore, various ESD protection circuits should be included in the device to protect its various components.

When an ESD discharge or an EOS (electrical overstress) event is coupled to a transistor or other semiconductor element, the high, pulsed voltage and current relative to the voltage- and current-sustaining capabilities of structures within the device can break down the transistor, and potentially cause latent or permanent damage. Consequently, circuits associated with input/output pads of an integrated circuit generally require protection from ESD pulses, and EOS events in general, so that they are not damaged by such occurrences.

Devices for ESD protection must be designed to carry a high current while clamping the voltage below the destruction voltage of a functional device and circuit during an ESD pulse. This requirement generates a need for ESD protection devices of substantial physical size in order to provide low series resistance for an ESD pulse to be clamped. The occurrence of voltages higher than an originally intended value can lead to ESD failures within the functional circuitry.

A number of ESD circuit design approaches for circuits that operate in a high-frequency regime have been proposed, but these often provide inadequate ESD protection for an electronic circuit that may be rated at a maximum voltage of only several volts, that may operate in a frequency regime that may be substantially higher than 10 GHz, and that is amenable to the low-cost demands of a high volume, competitive market.

Thus, there is a need for an ESD protection device capable of providing a sufficiently low impedance to ground for an ESD pulse without concurrent impedance loading of a node to be protected, and without substantial added product cost, thereby economically preventing failure of circuits and products due to ESD events.

SUMMARY OF THE INVENTION

In accordance with one exemplary embodiment, a circuit includes an ESD protection device providing ESD protection for a circuit node. In an advantageous embodiment, the circuit is an integrated circuit. In an advantageous embodiment, the circuit node is an external circuit node. In an advantageous embodiment, a transmission line is formed within the integrated circuit with a terminal coupled to the ESD protection device. In an advantageous embodiment, at least one conductive layer is deposited within the integrated circuit and patterned to form the transmission line. In an advantageous embodiment, the at least one conductive layer is at least one metallic layer. In an advantageous embodiment, the at least one metallic layer is already present in the integrated circuit for signal routing. The transmission line is coupled between the node and a terminal of an ESD protection device, with a return conductor of the transmission line coupled to high-frequency ground. The transmission line is formed with an electrical length that transforms an impedance of the ESD protection device substantially into an open circuit at the node at an operational frequency of the integrated circuit. Another terminal of the ESD protection device is coupled to high-frequency ground.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. In the figures, identical reference symbols generally designate the same component parts throughout the various views. For a more complete understanding of the invention, reference is now made to the following descriptions taken in conjunction with the accompanying drawings, in which:

DETAILED DESCRIPTION OF ILLUSTRATIVE EMBODIMENTS

Figure 1:
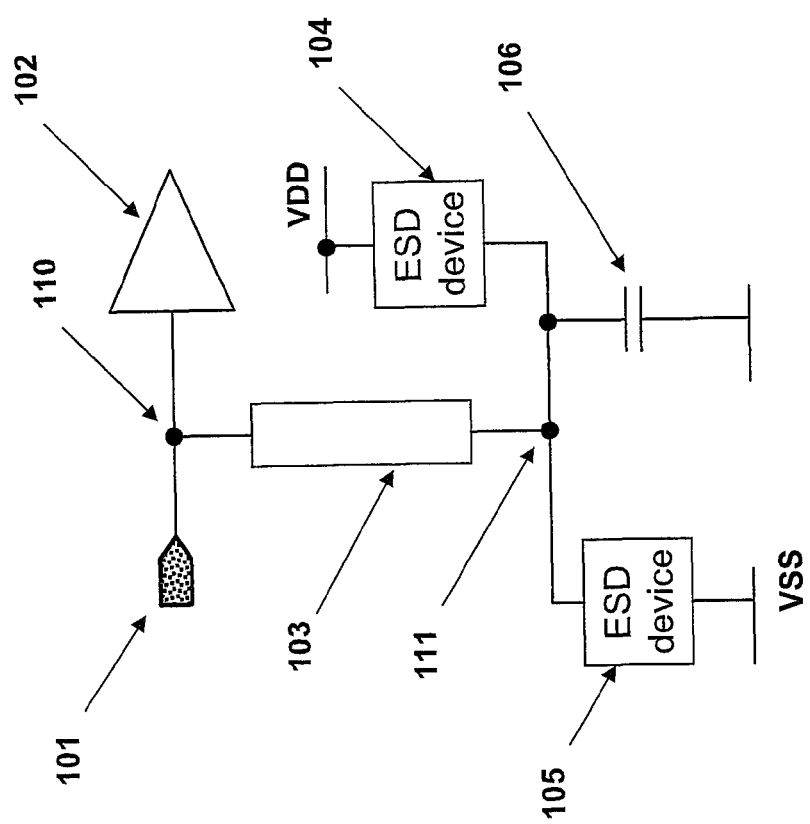
FIG. 1 illustrates a schematic drawing of an ESD protection circuit employing a waveguide transformer and ESD protection elements coupled to a circuit node to be protected, constructed according to an exemplary embodiment.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an ESD/EOS protection arrangement for an external circuit node such as a "pad" of an integrated circuit. The invention may also be applied, however, to other semiconductor structures requiring ESD/EOS protection, and is not limited to this particular implementation, or only to an external circuit node. Other integrated circuits can be protected from ESD/EOS discharges in different contexts using inventive concepts described herein.

Integrated ESD protection devices coupled to high-frequency circuits have the drawback of adding substantial parasitic capacitance to a signal line being protected. One approach to providing ESD protection for circuits that operate in a gigahertz frequency regime, and which are sensitive to added parasitic capacitance, includes a quarter-wave transformer to transform a short circuit representing an ESD protection device at high frequencies into an open circuit, as described by N. Shiga, in U.S. Pat. No. 5,416,660, entitled "Package for Microwave Device." Another approach employs a quarter-wave transformer to short an input node requiring ESD protection to RF ground, i.e., a waveguide transformer is coupled parallel to an ESD element, as described by T. Ohnakado in U.S. Pat. No. 6,847,511, entitled "Circuit Protecting against Electrostatic Discharge." A third approach employs a multi-section transmission line with multiple ESD protection devices coupled to nodes thereof and in parallel with the node of an ESD-sensitive circuit to be protected, as described by C. Ito, et al., in a paper entitled "Analysis and Design of Distributed ESD Protection Circuits for High-Speed Mixed-Signal and RF ICs," IEEE Transactions on Electron Devices, Vol. 49, No. 8, August 2002, pp. 1444-1454. These citations are hereby referenced and incorporated herein. However, none of these approaches provides adequate and economical ESD protection for an electronic circuit operable at frequencies substantially higher than 10 GHz with a maximum rated voltage of only several volts.

In an integrated circuit for high-frequency applications including ESD protection devices, constructed according to an advantageous embodiment, the ESD protection devices are decoupled from the RF signal line being protected. The effect on a high-frequency circuit of capacitive parasitic elements associated with the ESD protection devices are thereby minimized, allowing the ESD protection devices to be advantageously optimized independently from the rest of the circuit.

ESD protection devices that are included to prevent destruction of circuit elements in an ESD event, e.g., a thin gate oxide in a field-effect transistor, can be realized in a variety of ways. For example, to provide ESD protection, large area diodes such as avalanche diodes or other semiconductor devices such as p-n diodes, thyristors (also referred to as silicon controlled rectifiers or "SCRs") and GGNMOS devices (grounded-gate NMOS devices) are typically included in the integrated circuit design. A common design challenge when using any of these large area devices for ESD protection is to realize a sufficiently small series impedance to prevent a high voltage drop when a substantial current flows during an ESD discharge. For example, roughly one to ten amperes of current can flow during a typical ESD discharge, particularly for a discharge described by the ESD "charge-device model." A sufficiently small series impedance would result in a voltage pulse below a voltage level during an ESD discharge that could damage the integrated circuit. Small series ESD device impedance is often obtained by using large area devices, which inherently introduce substantial capacitance to a signal line being protected. The added parasitic capacitive load is a crucial drawback, particularly at frequencies higher than 10 GHz where the added capacitive load can substantially degrade circuit performance, as described by W. Soldner, et al., in the paper entitled "RF ESD Protection Strategies: Codesign vs. Low-C Protection," in the Proceedings of the EOS/ESD Symposium 2005, Microelectronics Reliability, Vol. 47, Iss. 7, July 2007, pp. 1008-1015, which is hereby referenced and incorporated herein.

To avoid the problem of added capacitance on a high-frequency signal line, two strategies are frequently used. One strategy is to reduce capacitive loading by using a small ESD protection device with a good ratio of protection to the added capacitive load. However, the reduction of capacitive loading is generally limited in view of the need to provide sufficiently low series resistance in the ESD protection device. Another strategy, referred to as "RF ESD codesign," is to isolate ESD protection devices with lumped-element impedance matching circuits, or, alternatively, to simply decouple the ESD protection devices using a series inductor. This strategy presents further drawbacks such as the problem of realizing an efficient, low-cost, lumped circuit element, such as an inductor, with sufficiently large inductance at the high frequencies of interest.

This problem is solved entirely "on chip" in an integrated circuit for high-frequency applications, constructed according to an advantageous embodiment, by decoupling the ESD protection device by means of a transmission line tuned to a characteristic of the ESD protection device. The transmission line is formed by patterning metal layers already present in a typical semiconductor integrated circuit. An ESD protection device with sufficiently low impedance for an ESD discharge can be constructed in an integrated circuit with the functional elements of the integrated circuit. The transmission line is selectively patterned to transform the finite, nonzero impedance of the ESD protection device into an open circuit at an operational frequency of the integrated circuit. The electrical length of the transmission line, which is not restricted to be a quarter-wavelength line, is chosen to produce substantially an open circuit at the operational frequency at the circuit node to be protected.

An advantage of using a transmission line to transform the finite impedance of an ESD protection device into an open circuit is that large size ESD protection elements can be used, which improves the ESD solution because the ESD protection device can exhibit properties more like a short circuit to RF ground at frequencies of interest during an ESD event. Because transmission lines can be implemented in an integrated circuit using ordinary fabrication processes for high-frequency applications, e.g., an operational frequency of 77

GHz as used in recent automotive radar systems, it can be used advantageously over lumped-element approaches. Inductors in integrated circuits, even at 77 GHz, present substantial implementation challenges.

An integrated circuit constructed according to an advantageous embodiment employs a transmission line as a waveguide transformer to decouple ESD protection devices from the path of an RF signal by transforming the finite, nonzero impedance of the ESD protection device into an open circuit at an operational frequency of the integrated circuit.

Turning now to FIG. 1, illustrated is a schematic drawing of an ESD protection circuit employing an exemplary RF transmission line 103 as a waveguide transformer. In FIG. 1, input pad 101 represents an external input node to the circuit, which is coupled to ESD-sensitive circuit element 102. The RF transmission line 103 transforms the impedance of ESD protection devices 104 and 105 into substantially an open circuit at circuit node 110 at an operational frequency of the integrated circuit. The other terminal of these ESD protection devices is coupled to local circuit ground, VSS, or to a bias voltage rail, VDD, both of which are generally at RF ground potential. In this way ESD protection devices 104 and 105 are decoupled from the input of ESD-sensitive circuit 102 at the main working frequency of the circuit.

The ESD protection devices 105 and 104 typically have "inverse" capacitance versus voltage characteristics. For example, for a rising positive dc bias at node 101, the capacitance of ESD protection device 105 decreases, while the capacitance of ESD protection device 104 increases. Thus, the overall capacitance coupled to node 101 remains substantially constant with varying voltage, making the design of the transmission line easier.

Figure 4:
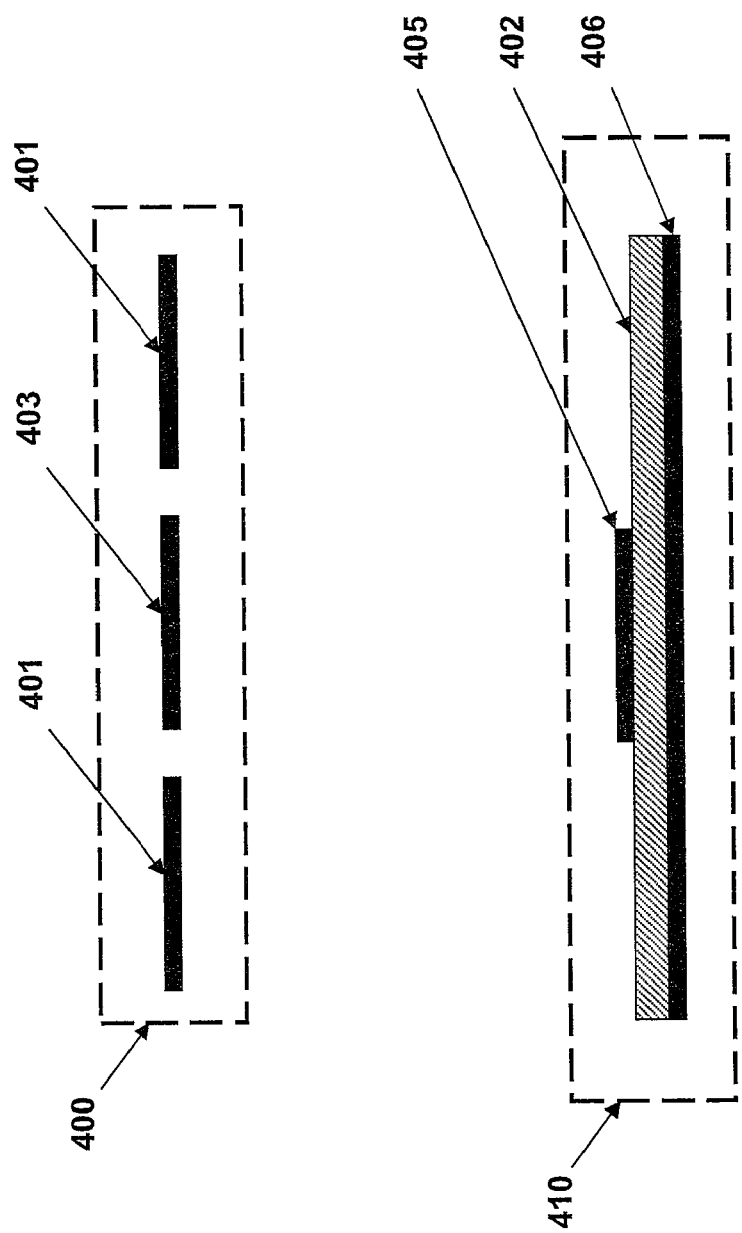
FIG. 4 illustrates elevation-view drawings of exemplary waveguide/transmission line structures, constructed according to exemplary embodiments.

Transmission line 103 is shown in FIG. 1 as a planar waveguide, but other waveguide structures utilizing one or more conductive layers of an integrated circuit are contemplated within the broad scope of the invention, for example and without limitation, the exemplary waveguide/transmission line structures illustrated in FIG. 4. Conductive layers of an integrated circuit can be formed, without limitation, as doped semiconductor structures or as metallic layers deposited and patterned within the device. For example, and without limitation, two conductive layers formed as metallic layers of a semiconductor device separated by an insulating layer can be patterned to form a waveguide with a high-frequency electromagnetic field substantially confined to the insulating layer between the two conductive layers. The second conductive layer can be advantageously used as a return conductor for the waveguide/transmission line structure. The positioning of couplings of the return conductor of transmission line 103 to local RF circuit ground such as VSS can be readily selected to meet the needs of a particular integrated circuit layout. Of course, the transmission line may also be realized as a series of integrated lumped circuit elements, such as lumped resistor-inductor-capacitor circuit elements.

At low frequencies (with respect to Fourier components of an ESD pulse) the waveguide/transmission line structure provides a short circuit for an ESD discharge through either of the ESD protection devices. To achieve adequate ESD protection, waveguides and ESD protection devices with high quality factor can be advantageously used. High quality factor generally suggests the use of circuit elements with low series resistance at low frequencies, particularly for low-loss impedance transformation. Due to decoupling with the impedance-transforming transmission line, the ESD protection device can be chosen with sufficient size to provide low series resistance in view of the ESD discharge current without degrading RF performance of the application circuit. Increasing the size of an ESD protection device brings its impedance closer to a short circuit, improving the waveguide transformation properties, thereby reducing overall losses.

Capacitor 106 illustrated in FIG. 1, which may be optionally included in the circuit and coupled to local circuit ground VSS or to bias voltage rail VDD, provides an additional low-impedance path to RF ground, which leads to a quarter-wave transformer for the waveguide if the net impedance at circuit node 111 is sufficiently small.

Figure 2:
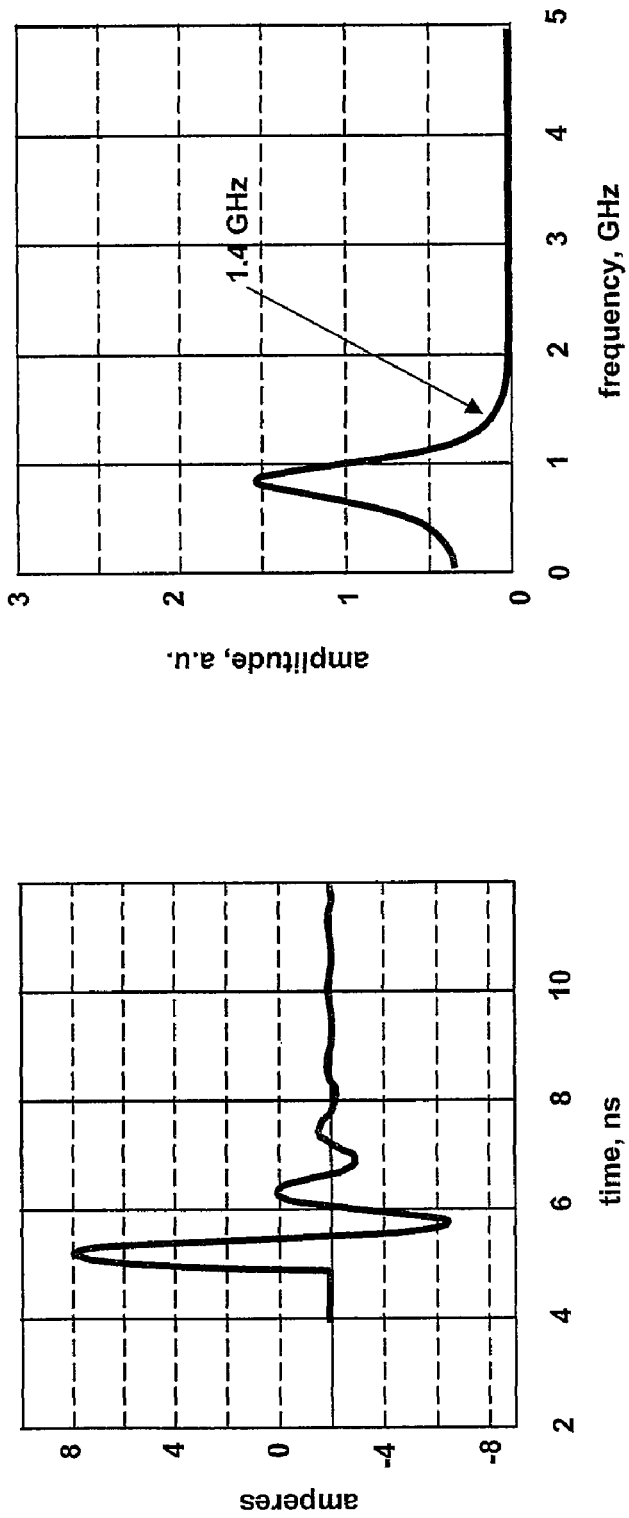
FIG. 2 illustrates a graph of an exemplary current waveform of a charge-device model ESD pulse and its frequency spectrum.

An integrated circuit constructed according to an advantageous embodiment is especially useful for very high frequencies because a fast ESD pulse, particularly an ESD pulse conforming to the charge-device model, exhibits substantial frequency components in the range of 1 to 2 GHz, and therefore it is less influenced by the isolation properties of the waveguide transformer, particularly for an application circuit with a substantially higher operational frequency such as 77 GHz. As illustrated in the left portion of FIG. 2, which illustrates a graph of an exemplary current waveform of an ESD pulse, a charge-device model pulse ("CDM pulse") exhibits an oscillatory response over a time interval of roughly 3 ns. As illustrated in the right portion of FIG. 2, the frequency spectrum ("CDM spectrum (current)," in arbitrary units along the vertical axis of the graph) of the highest frequencies of this pulse correspondingly falls in the range of 1 to 2 GHz.

Figure 3:
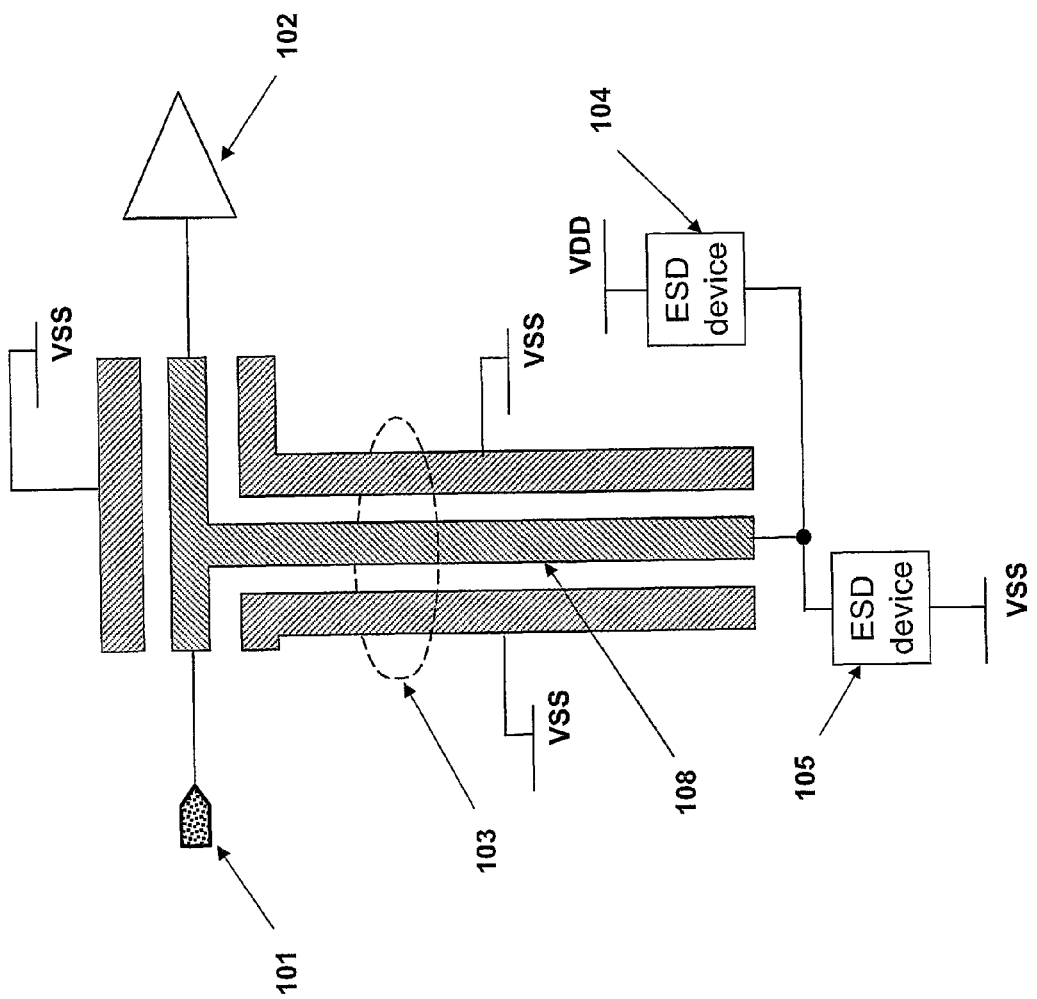
FIG. 3 illustrates a schematic drawing of a waveguide transformer for an RF ESD protection circuit, constructed according to an exemplary embodiment.

Turning now to FIG. 3, illustrated is an RF ESD protection arrangement including a waveguide transformer formed as RF transmission line 103, constructed according to an advantageous embodiment. Low-impedance metallic layers ordinarily used for interconnection of circuit elements in an integrated circuit are employed to construct the waveguide transformer. In this manner, the low series resistance of the central conductor 108 of the waveguide transformer does not degrade ESD performance. Here coplanar waveguides are used which can be realized in metallic layers of an integrated circuit so that a sufficiently low series resistance can be obtained, thereby not spoiling ESD performance. Other possibilities to realize a transmission line include, without limitation, stacked metal layers with viabars to reduce ohmic resistance, a microstrip line with wafer backside metallization for a ground plate, a ground signal ground stripe in the vertical direction, or a conductive structure formed with a conductive material other than a metal, such as a doped semiconductor. Numerous options are known in the art to realize a microstrip or coplanar waveguide. The ESD protection devices themselves can be realized using large p-n and n-p diodes. Other elements in FIG. 3 as in other figures with the same reference designation used in a previous figure will not be redescribed in the interest of brevity.

Turning now to FIG. 4, illustrated are elevation-view drawings of exemplary waveguide/transmission line structures, 400 and 410, constructed according to exemplary embodiments. Waveguide/transmission line structure 400 illustrates a transmission line formed by patterning a single metallic layer to form central transmission line conductor 403 and return conductors 401. A metallic layer can comprise an aluminum or other metallic layer formed within an integrated circuit structure. Waveguide/transmission line structure 410 illustrates a transmission line formed in two metallic layers separated by insulating layer 402. An insulating layer can be formed in an integrated circuit structure using techniques well known in the art, and will not be described further in the interest of brevity. Conductor 405 is the central transmission line conductor and conductor 406 is the return conductor. Of course, other transmission line structures formed by depositing and patterning metallic and/or other conductive layers of an integrated circuit are contemplated within the broad scope of the invention, including depositing and patterning three or more metallic layers to form a transmission line, as well as depositing and patterning a semiconductor layer to form a transmission line conductive element.

Figure 5:
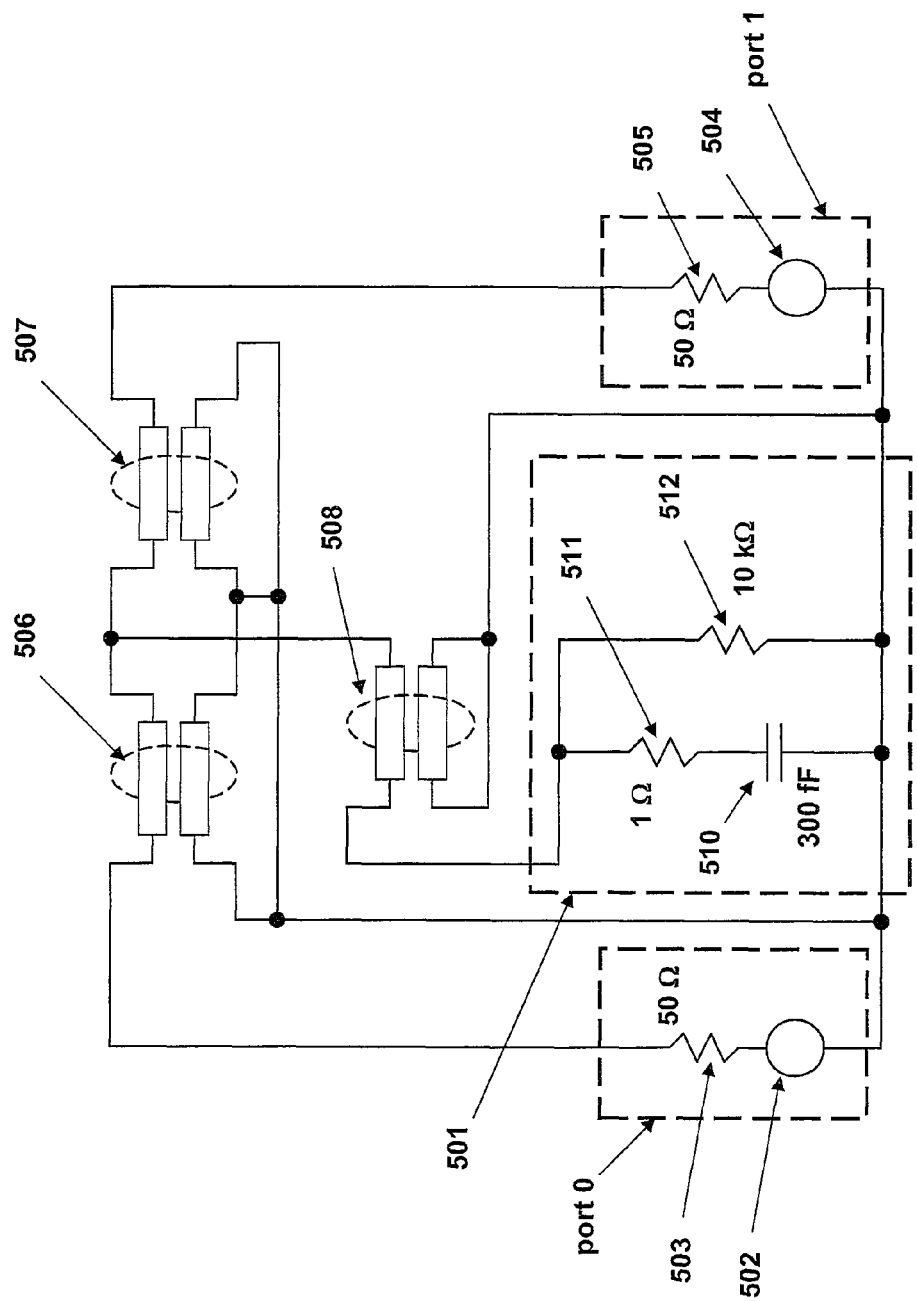
FIG. 5 illustrates a schematic drawing of a circuit to simulate an ESD protection circuit employing a waveguide transformer, constructed according to an exemplary embodiment.

Turning now to FIG. 5, illustrated is a schematic drawing of a circuit used to simulate an ESD protection circuit employing a waveguide transformer, constructed according to an exemplary embodiment. The circuit represents a high-frequency network with two ports, port 0 and port 1. Each port is coupled, respectively, to a voltage source, 502 and 504, in series with a 50Ω resistor, resistors 503 and 505. ESD protection device 501 is represented by its series resistance 511, its capacitance, 510, and its effective parallel resistance, 512. Exemplary values used for simulation of these parasitic elements are indicated in FIG. 5. The transmission line that transforms the impedance of the ESD element is represented by transmission line 508. Transmission line 508 was represented in the simulation by a waveguide structure approximately 1 mm in length to produce substantially an open circuit at 77 GHz at its right end. Transmission lines 506 and 507 were simulated with a characteristic impedance of 50Ω. The length of transmission lines 506 and 507 was not a critical parameter in the simulation.

Figure 6:
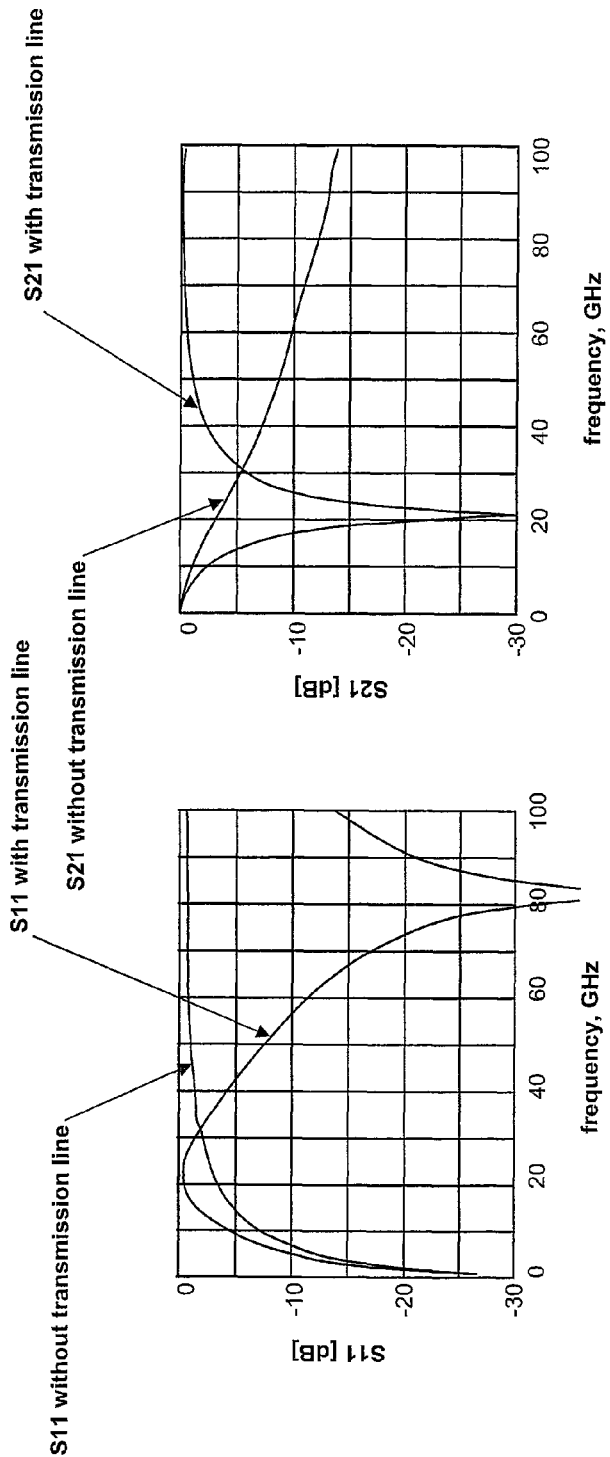
FIG. 6 illustrates graphs showing the result of simulation of the input refection s-parameter and the forward transmission s-parameter of the circuit illustrated in FIG. 5, with and without a waveguide transformer, constructed according to an exemplary embodiment.

Turning now to FIG. 6, illustrated are two graphs showing plots of the result of simulation of the circuit illustrated in FIG. 5, with and without a waveguide transformer. The graphs show the network parameters S11 and S21. The network parameter S11 is the input reflection s-parameter of a network, which is the ratio of a reflected voltage signal to an incident voltage signal. The network parameter S21 is the forward transmission s-parameter of a network, which is the ratio of the outgoing voltage signal to the incident voltage signal. As can be noted from the graphed values of S11 and S21, the circuit exhibits high gain at the high frequencies where the function of the waveguide is operative to decouple the ESD protection devices. The simulation shows that the capacitive loading of the ESD protection device can be completely compensated by the waveguide transformer. It is evident from these graphs that the circuit, which is typically applied in a narrowband application, is operative over a wide, high-frequency range. In addition, due to the transmission line impedance-transformation properties, good impedance matching can be achieved, reducing the input reflection s-parameter S11 significantly for the frequency of application. The parameter S21, on the other hand, shows a broad peak which allows wideband operation over a broad range of frequencies.

Figure 7:
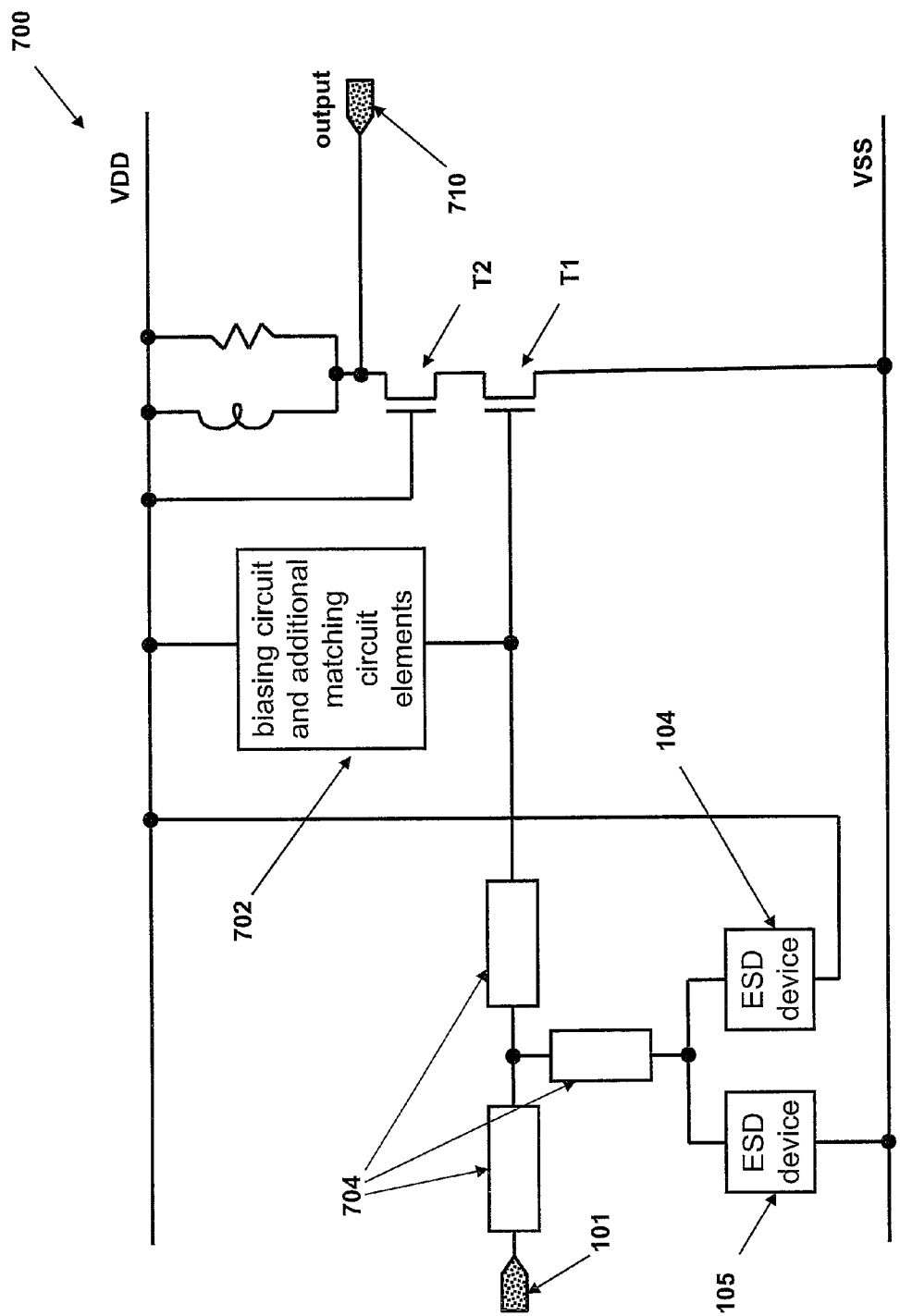
FIG. 7 illustrates a schematic drawing of a high-frequency, low-noise amplifier circuit including ESD protection for input and output nodes, constructed according to an exemplary embodiment.

Turning now to FIG. 7, illustrated is a schematic drawing of a high-frequency, low-noise amplifier circuit 700 formed as an integrated circuit, including ESD protection for input node 101 and output node 710, constructed according to an exemplary embodiment. The low-noise amplifier circuit 700 is an exemplary application of ESD protection for input and output nodes that conduct high-frequency signals that should not be burdened with significant capacitive loading, which would degrade high-frequency signal processing performance of the circuit. The amplifier includes ESD protection device 104 coupled to a VDD bias voltage rail, and ESD protection device 105 coupled to local circuit ground, i.e., bias voltage rail VSS. In a typical low-noise amplifier circuit, a high-frequency, low impedance path (not shown) between bias voltage rails VDD and VSS is generally included in the circuit, which may also include a further ESD protection device coupled between these two rails, such as described in co-pending U.S. patent application Ser. No. 11/844,965, filed Aug. 24, 2007, entitled, "Diode-Based ESD Concept for DEMOS Protection," which is hereby referenced and incorporated herein. The further ESD protection device coupled between bias voltage rails is generally not required to provide low capacitive loading. Low-noise amplifier 700 is formed with transistors T1 and T2 coupled in series. The gate of transistor T1 is biased by biasing circuit 702 coupled to bias voltage rail VDD, including additional impedance matching circuit elements as necessary for an application. Transistor T2, which is generally operated in a saturated conduction state, provides cascode Miller-effect isolation for transistor T1. Input signal circuit paths 704 would generally be formed using RF transmission line structures as described hereinabove with reference to FIGS. 1 and 3. Thus, a system requiring ESD protection for high-frequency input and output nodes, represented by a low-noise amplifier circuit, is advantageously formed including an RF transmission line structure. An RF transmission line structure can advantageously be formed in a metallic layer of an integrated circuit to reduce capacitive parasitic node loading of a high-frequency signal path with minimal incremental expense.

An ESD protection arrangement for a circuit node of an integrated circuit has thus been introduced. In accordance with one exemplary embodiment, the integrated circuit includes an ESD protection device coupled to a transmission line. In an advantageous embodiment, the transmission line includes a conductive layer deposited and patterned within the integrated circuit. In an advantageous embodiment, the conductive layer is a metallic layer. In an advantageous embodiment, the circuit node is an external node. A first terminal of the transmission line is coupled to the node, and a second terminal of the transmission line is coupled to a first terminal of the ESD protection device. In an advantageous embodiment, the transmission line further includes a return conductor coupled to high-frequency ground. In an advantageous embodiment, the ESD protection device further includes a second terminal coupled to high-frequency ground. In an advantageous embodiment, the transmission line is formed with an electrical length such that an impedance of the ESD protection device is transformed substantially into an open circuit at the node at an operational frequency of the integrated circuit. The transmission line provides a low-impedance path between the first terminal of the ESD protection device and the node at frequencies substantially lower than an operational frequency of the integrated circuit, such as frequencies that are more than a decade lower than the operational frequency. In this manner, an ESD discharge current advantageously does not generate a voltage pulse at the node of sufficient magnitude to destroy the integrated circuit or otherwise adversely affect its operability. In an advantageous embodiment, the transmission line comprises two metallic layers separated by an insulating layer. In an advantageous embodiment, at least one of the two metallic layers is a patterned metallic layer. In an advantageous embodiment, a second ESD protection device is coupled between the second terminal of the transmission line and a high-frequency ground. In an advantageous embodiment, the high-frequency ground is a bias voltage rail. In an advantageous embodiment, the ESD protection device, without limitation, is an avalanche diode, a p-n diode, a silicon controlled rectifier, or a grounded-gate NMOS device.

Another exemplary embodiment provides a method of constructing an integrated circuit formed with a circuit node requiring ESD protection. In a preferred embodiment, the circuit node is an external node. In a preferred embodiment, the method includes forming a transmission line, and coupling a first terminal of the transmission line to an ESD protection device. In an advantageous embodiment, the method includes depositing a first conductive layer within the integrated circuit, and patterning the first conductive layer to form the transmission line. In an advantageous embodiment, the first conductive layer comprises a metallic layer. In an advantageous embodiment, the method further includes depositing a second metallic layer within the integrated circuit, and patterning the second metallic layer to form the transmission line with the first metallic layer. The method further includes depositing an insulating layer between the second metallic layer and the first metallic layer. The method further includes coupling a second terminal of the transmission line to the circuit node. The method further includes forming a second conductor of the transmission line and coupling the second conductor to a high-frequency ground. The method further includes forming the transmission line with an electrical length to transform an impedance of the ESD protection device substantially into an open circuit at the node at an operational frequency of the integrated circuit. In an advantageous embodiment, the transmission line provides a low-impedance path between the first terminal of the ESD protection device and the node at frequencies substantially lower than the operational frequency of the integrated circuit. The method further includes coupling a second terminal of the ESD protection device to a high-frequency ground. In an advantageous embodiment, the method further includes coupling a second ESD protection device between the first terminal of the transmission line and a high-frequency ground. In an advantageous embodiment, the high-frequency ground is a bias voltage rail. In a further advantageous embodiment, the bias voltage rail is coupled to a local circuit ground with a further ESD protection device.

Another exemplary embodiment provides a circuit including a circuit node requiring ESD protection. In a preferred embodiment, the circuit includes an ESD protection device and a transmission line. A first terminal of the transmission line is coupled to the circuit node, and a second terminal of the transmission line is coupled to a first terminal of the ESD protection device. In an advantageous embodiment, the transmission line has an electrical length to transform an impedance of the ESD protection device substantially into an open circuit at the circuit node at an operational frequency of the circuit. In an advantageous embodiment, the circuit is an integrated circuit, and the circuit node is a circuit node of the integrated circuit. In an advantageous embodiment, the transmission line has an electrical length greater than a quarter wavelength. In an advantageous embodiment the ESD protection device is a discrete semiconductor device.

Although an ESD/EOS protection device and related method have been described for application to an integrated circuit that processes high-frequency signals, it should be understood that other applications of an ESD/EOS protection device are contemplated within the broad scope of the invention, and need not be limited to such integrated circuits.

Although the invention has been shown and described primarily in connection with specific exemplary embodiments, it should be understood by those skilled in the art that diverse changes in the configuration and the details thereof can be made without departing from the essence and scope of the invention as defined by the claims below. The scope of the invention is therefore determined by the appended claims, and the intention is for all alterations that lie within the range of the meaning and the range of equivalence of the claims to be encompassed by the claims.

What is claimed is:

1. A method of coupling an electrostatic discharge (ESD) protection device in an integrated circuit to a circuit node of the integrated circuit, the method comprising:

depositing a first conductive structure within the integrated circuit, the first conductive structure comprising a first metallic layer;

patterning the first conductive structure to form a transmission line;

depositing a second metallic layer within the integrated circuit;

patterning the second metallic layer to form the transmission line with the first metallic layer;

depositing an insulating layer within the transmission line between the second metallic layer and the first metallic layer; and coupling a first terminal of the transmission line to a first terminal of the ESD protection device and a second terminal of the transmission line to the circuit node, wherein the transmission line provides a low-impedance path between the first terminal of the ESD protection device and the circuit node at frequencies substantially lower than an operational frequency at the circuit node.

2. The method as claimed in claim 1, further including forming a second conductor of the transmission line and coupling the second conductor to a high-frequency ground.

3. The method as claimed in claim 1, further including forming the transmission line with an electrical length to transform an impedance of the ESD protection device substantially into an open circuit at the circuit node at an operational frequency of the integrated circuit.

4. The method as claimed in claim 1, further including coupling a second terminal of the ESD protection device to a high-frequency ground.

5. The method as claimed in claim 1, further including coupling a second ESD protection device between the first terminal of the transmission line and a high-frequency ground.

6. The method as claimed in claim 5, wherein the high-frequency ground is a bias voltage rail.

7. A method of protecting a circuit coupled to a circuit node configured to operate at an operational frequency, the method comprising:

receiving an electrostatic discharge (ESD) pulse at the circuit node; and decoupling the ESD pulse through an ESD protection device coupled to the circuit node via a transmission line disposed on an integrated circuit, the transmission line comprising two metallic layers of the integrated circuit separated by an insulating layer, wherein the transmission line forms a low-impedance path between the circuit node and a first terminal of the ESD protection device at frequencies substantially lower than an operational frequency at the circuit node.

8. The method of claim 7, wherein the ESD protection device is disposed on the integrated circuit.

9. The method of claim 8, wherein the circuit is further disposed on the integrated circuit.

10. The method of claim 7, wherein the transmission line comprises an electrical length such that the transmission line presents substantially an open circuit between the circuit node at the operational frequency of the circuit.

11. The method of claim 7, wherein the ESD device comprises a plurality of ESD devices.

12. A method of operating an integrated circuit comprising an electrostatic discharge (ESD) protection device, and a transmission line formed within the integrated circuit, the transmission line comprising two metallic layers of the integrated circuit separated by an insulating layer, wherein a first terminal of the transmission line is coupled to a circuit node, a second terminal of the transmission line is coupled to a first terminal of the ESD protection device, and the transmission line provides a low-impedance path between the first terminal of the ESD protection device and the circuit node at frequencies substantially lower than an operational frequency at the circuit node, the method comprising:
operating the circuit at the operational frequency.

13. The method of claim 12, further comprising:
receiving an ESD pulse at the circuit node; and
coupling the ESD pulse to a high-frequency ground via the transmission line and the ESD protection device.

14. The method of claim 13, wherein the transmission line comprises an electrical length such that the transmission line presents substantially an open circuit between the circuit node at the operational frequency of the circuit.

15. The method of claim 13, wherein operational frequency is greater than 10 GHz.

16. The method of claim 15, wherein the operational frequency is about 77 GHz.

17. The method of claim 13, wherein the transmission line comprises a microstrip.

* * * * *